United States Patent
Bartley et al.

(10) Patent No.: US 9,245,813 B2
(45) Date of Patent: Jan. 26, 2016

(54) HORIZONTALLY ALIGNED GRAPHITE NANOFIBERS IN ETCHED SILICON WAFER TROUGHS FOR ENHANCED THERMAL PERFORMANCE

(71) Applicant: International Business Machines Corporation, Armonk, NY (US)

(72) Inventors: Gerald K. Bartley, Rochester, MN (US); Charles L. Johnson, Rochester, MN (US); John E. Kelly, III, Poughquag, NY (US); Joseph Kuczynski, Rochester, MN (US); David R. Motschman, Rochester, MN (US); Arvind K Sinha, Rochester, MN (US); Kevin A. Splittstoesser, Stewartville, MN (US); Timothy A. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/754,149

(22) Filed: Jan. 30, 2013

(65) Prior Publication Data

US 2014/0210068 A1 Jul. 31, 2014

(51) Int. Cl.
*H01L 23/34* (2006.01)
*H01L 23/00* (2006.01)
(Continued)

(52) U.S. Cl.
CPC ............ *H01L 23/00* (2013.01); *H01L 21/4882* (2013.01); *H01L 23/36* (2013.01); *H01L 23/373* (2013.01); *H01L 23/42* (2013.01);
(Continued)

(58) Field of Classification Search
CPC .......................... H05K 7/2039; H01L 23/3733
See application file for complete search history.

(56) References Cited

U.S. PATENT DOCUMENTS 4,882,399 A    11/1989  Tesoro et al.
5,506,753 A *   4/1996  Bertin ................. H01L 25/0657
                                                      165/185
(Continued)

FOREIGN PATENT DOCUMENTS

JP    2002273741 A    9/2002
JP    2006193836 A    7/2006
(Continued)

OTHER PUBLICATIONS

Baker, R.T.K., "Synthesis, properties and applications of graphite nanofibers," Published: Jan. 1998; WTEC Hyper-Librarian, www.wtec.org/loyola/nano/us_r_n_d/09_03.htm. Downloaded May 4, 2011.
(Continued)

*Primary Examiner* — Cuong Q Nguyen
*Assistant Examiner* — Nishath Yasmeen
(74) *Attorney, Agent, or Firm* — Stachler Intellectual Property Law LLC

(57) ABSTRACT

The chip stack of semiconductor chips with enhanced cooling apparatus includes a first chip with circuitry on a first side and a second chip electrically and mechanically coupled to the first chip by a grid of connectors. The apparatus further includes a thermal interface material pad between the first chip and the second chip, wherein the thermal interface material pad includes nanofibers aligned parallel to mating surfaces of the first chip and the second chip, and a heat removal device thermally connected to the thermal interface material pad.

13 Claims, 7 Drawing Sheets

(51) Int. Cl.

| | | |
|---|---|---|
| *H01L 23/373* | (2006.01) | |
| *H01L 23/36* | (2006.01) | |
| *H01L 23/42* | (2006.01) | |
| *H01L 23/427* | (2006.01) | |
| *H01L 21/48* | (2006.01) | |
| *H01L 25/065* | (2006.01) | |
| *H01L 23/48* | (2006.01) | |

(52) U.S. Cl.
CPC ........ *H01L23/4275* (2013.01); *H01L 25/0657* (2013.01); *H01L 23/481* (2013.01); *H01L 2225/06513* (2013.01); *H01L 2225/06541* (2013.01); *H01L 2225/06589* (2013.01); *H01L 2924/0002* (2013.01)

(56) References Cited

U.S. PATENT DOCUMENTS

| | | |
|---|---|---|
| 5,912,282 A | 6/1999 | Iyer et al. |
| 6,407,922 B1 | 6/2002 | Eckblad et al. |
| 6,537,515 B1 | 3/2003 | Baker et al. |
| 6,721,796 B1 | 4/2004 | Wong |
| 6,730,731 B2 | 5/2004 | Tobita et al. |
| 6,741,019 B1 | 5/2004 | Filas et al. |
| 6,764,759 B2 | 7/2004 | Duvall et al. |
| 6,790,425 B1 | 9/2004 | Smalley et al. |
| 6,891,724 B2 | 5/2005 | De Lorenzo et al. |
| 6,965,513 B2 | 11/2005 | Montgomery et al. |
| 7,189,778 B2 | 3/2007 | Tobita et al. |
| 7,238,415 B2 | 7/2007 | Rodriguez et al. |
| 7,270,795 B2 | 9/2007 | Kawakami et al. |
| 7,387,747 B2 | 6/2008 | Taya et al. |
| 7,550,129 B2 | 6/2009 | Baker et al. |
| 7,592,389 B2 | 9/2009 | Baker et al. |
| 7,649,308 B2 | 1/2010 | Lee et al. |
| 7,658,865 B2 | 2/2010 | Lu |
| 7,674,410 B2 | 3/2010 | Huang et al. |
| 7,784,531 B1 | 8/2010 | Li et al. |
| 7,803,262 B2 | 9/2010 | Haik et al. |
| 7,847,394 B2 | 12/2010 | Dubin et al. |
| 8,039,953 B2 | 10/2011 | Dangelo |
| 8,048,794 B2 | 11/2011 | Knickerbocker |
| 8,106,510 B2 | 1/2012 | Altman et al. |
| 2002/0054849 A1 | 5/2002 | Baker et al. |
| 2004/0150100 A1 | 8/2004 | Dubin et al. |
| 2005/0061496 A1* | 3/2005 | Matabayas ............. B82Y 10/00 165/185 |
| 2005/0239948 A1 | 10/2005 | Haik et al. |
| 2005/0269726 A1 | 12/2005 | Matabayas |
| 2006/0211327 A1 | 9/2006 | Lee et al. |
| 2006/0286712 A1 | 12/2006 | Brunschwiler et al. |
| 2008/0001283 A1* | 1/2008 | Lee ..................... H01L 25/0657 257/712 |
| 2008/0042261 A1 | 2/2008 | Wolter et al. |
| 2008/0080144 A1* | 4/2008 | Machiroutu ........ H01L 23/3735 361/719 |
| 2009/0068387 A1 | 3/2009 | Panzer et al. |
| 2009/0166021 A1 | 7/2009 | Slaton et al. |
| 2009/0224422 A1 | 9/2009 | Dubin |
| 2009/0236037 A1 | 9/2009 | Fisher et al. |
| 2009/0247652 A1 | 10/2009 | Silverman et al. |
| 2009/0269604 A1 | 10/2009 | Wang et al. |
| 2009/0317660 A1 | 12/2009 | Heintz et al. |
| 2010/0003530 A1 | 1/2010 | Ganguli et al. |
| 2010/0224352 A1 | 9/2010 | Stuckey et al. |
| 2011/0189500 A1 | 8/2011 | Majumdar et al. |
| 2012/0292103 A1 | 11/2012 | Dijon |

FOREIGN PATENT DOCUMENTS

| | | | |
|---|---|---|---|
| JP | 2007012911 A | | 1/2007 |
| JP | 2009084746 A | | 4/2009 |
| JP | 2009246258 A | | 10/2009 |
| JP | 2010034254 A | | 2/2010 |
| JP | 2010050259 A | * | 3/2010 |
| JP | 2010050259 A2 | | 3/2010 |
| KR | 1020050107094 A | | 11/2005 |
| KR | 1020070023212 A | | 2/2007 |
| KR | 1020110037055 A | | 4/2011 |
| WO | 2004090944 A2 | | 10/2004 |
| WO | 2005031864 A1 | | 4/2005 |
| WO | 2006044938 A2 | | 4/2006 |
| WO | 2007089257 A2 | | 8/2007 |
| WO | 2008112013 A1 | | 9/2008 |
| WO | 2009075320 A1 | | 6/2009 |

OTHER PUBLICATIONS

Fleischer et al., "Transient thermal management using phase change materials with embedded graphite nanofibers for systems with high power requirements," 11th Intersociety Conference on Thermal and Thermomechanical Phenomena in Electronic Systems, 2008. ITHERM 2008. May 28-31, 2008, pp. 561-566.

Ishioka et al., "Formation and Characteristics Vapor Grown Carbon Fibers Prepared in Linz-Donawitz Converter Gas," Carbon, vol. 30, No. 7, pp. 975-979. 1992.

Ishioka et al. "Formation of Vapor-Grown Carbon Fibers in CO—CO2—H2 Mixtures, I. Influence of Carrier Gas Composition," Carbon, vol. 30, No. 6, pp. 859-863, 1992.

Kopec et al., "Transient thermal performance of phase change materials with embedded graphite nanofibers," in "Thermes 2007: Thermal Challenges in Next Generation Systems," Garmella, S.V. and Fleischer, A.S., eds., Millpress, Rotterdam, The Netherlands, 2007, pp. 137-144.

Kuczynski et al. U.S. Appl. No. 12/842,200, "Method and System for Alignment of Graphite Nanofibers for Enhanced Thermal Interface Material Performance", filed Jul. 23, 2010.

Ruoff et al., "Mechanical and thermal properties of carbon nanotubes," Carbon, vol. 33, No. 7, pp. 925-930, 1995.

Tibbetts, Gary G., "Growing Carbon Fibers with a Linearly Increasing Temperature Sweep: Experiments and Modeling," Carbon, vol. 30, No. 3, pp. 399-406, 1992.

Weinstein et al., "The Experimental Exploration of Embedding Phase Change Materials with Graphite Nanofibers for the Thermal Management of Electronics", J. Heat Transfer, vol. 130, Issue 4. Apr. 2008. 8 pp.

Xie et al., "Dispersion and alignment of carbon nanotubes in polymer matrix: A review," Materials Science and Engineering: R: Reports, vol. 49, Issue 4, pp. 89-112, May 19, 2005.

Disclosed Anonymously, "Stretchable Thermal Interface Materials for Alignment of Graphitic Structures for Chipstack Cooling", IP.com Prior Art Database, IP.com No. IPCOM000213539D, Dec. 20, 2011.

Rodriguez et al., "Catalytic Engineering of Carbon Nanostructures", Langmuir 1995, pp. 3862-3866.

Tong, Tao et al., "Dense Vertically Aligned Multiwalled Carbon Nanotube Arrays as Thermal Interface Materials", IEEE Transactions on Components and Packaging Technologies, vol. 30, No. 1, Mar. 2007, pp. 92-100.

* cited by examiner

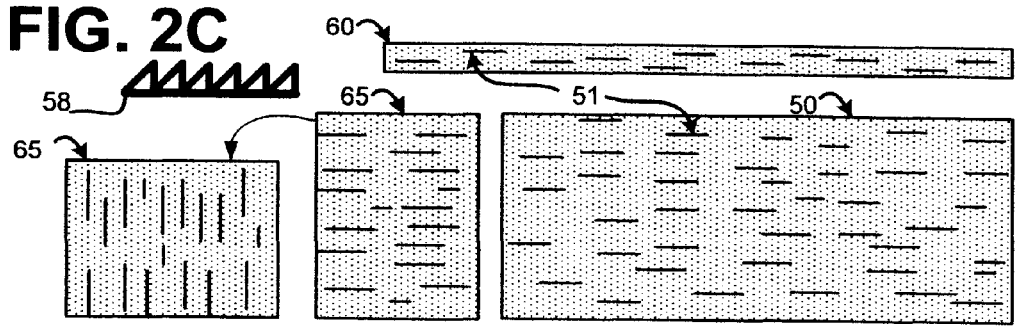
FIG. 2C
FIG. 3A FIG. 3B
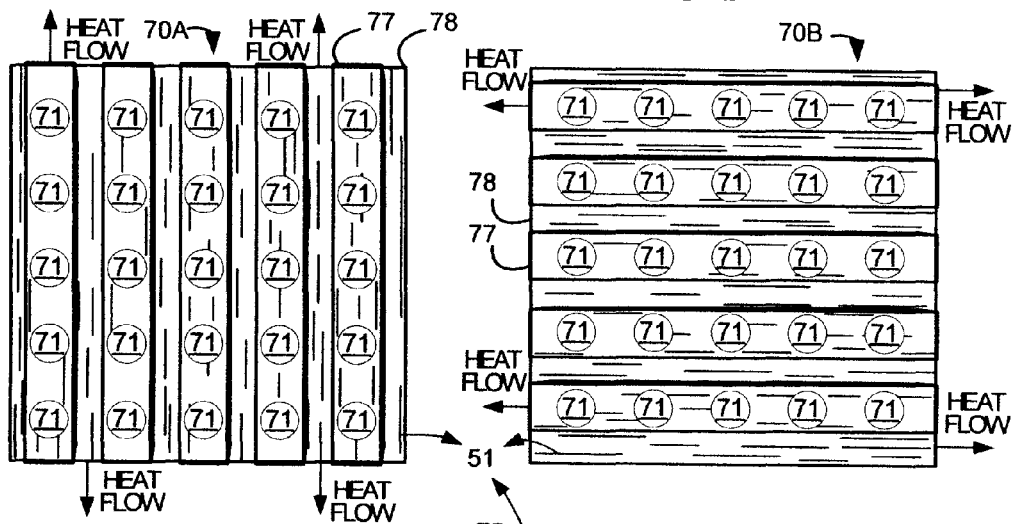
FIG. 3C FIG. 3E
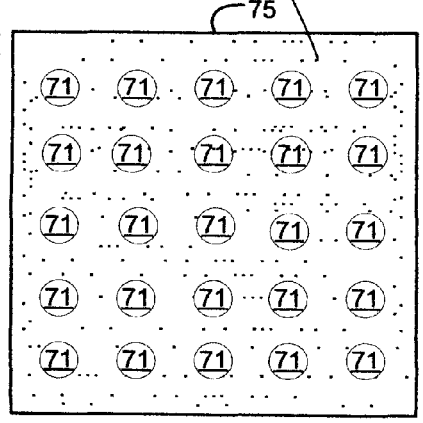
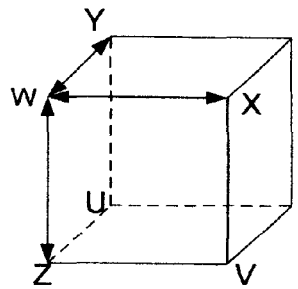

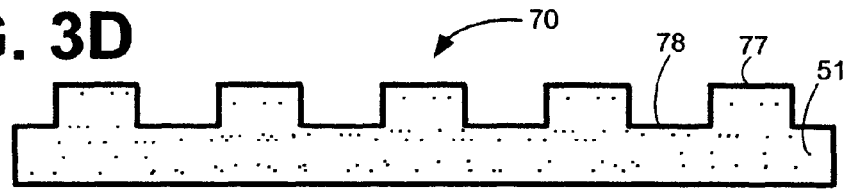
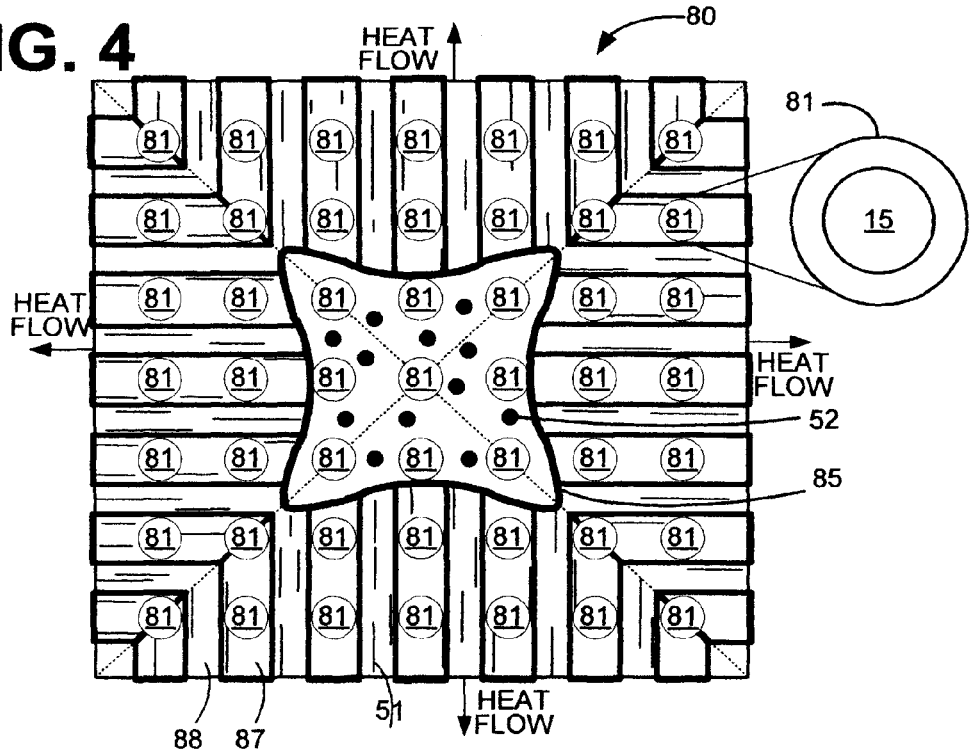
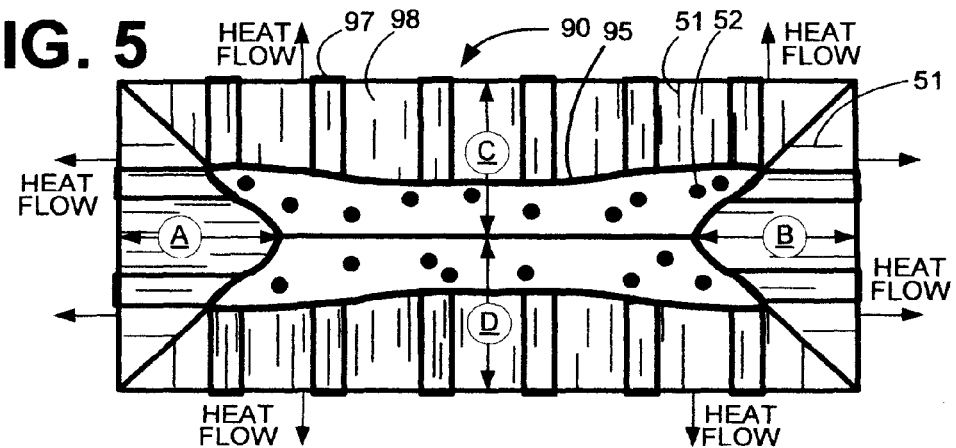

HORIZONTALLY ALIGNED GRAPHITE NANOFIBERS IN ETCHED SILICON WAFER TROUGHS FOR ENHANCED THERMAL PERFORMANCE

FIELD OF THE INVENTION

The present invention generally relates to thermal interface materials, and more particularly, to a method and system for aligning graphite nanofibers in a thermal interface material used in three dimensional chip stacks.

BACKGROUND

Thermal interfaces in microelectronics packages are commonly credited with a majority of the resistance for heat to escape from the chip to an attached cooling device (e.g. heat sinks, spreaders and the like). Thus, in order to minimize the thermal resistance between the heat source and cooling device, a thermally conductive paste, thermal grease or adhesive is commonly used. Thermal interfaces are typically formed by pressing the heat sink or chip cap onto the backside of the processor chip with a particle-filled viscous medium between, which is forced to flow into cavities or non-uniformities between the surfaces.

Thermal interface materials are typically composed of an organic matrix highly loaded with a thermally conductive filler. Thermal conductivity is driven primarily by the nature of the filler, which is randomly and homogeneously distributed throughout the organic matrix. Commonly used fillers exhibit isotropic thermal conductivity and thermal interface materials utilizing these fillers must be highly loaded to achieve the desired thermal conductivity. Unfortunately, these loading levels degrade the properties of the base matrix material (such as flow, cohesion, interfacial adhesion, etc.).

It has been determined that stacking layers of electronic circuitry (i.e. 3 dimensional chip stack) and vertically interconnecting the layers provides a significant increase in circuit density per unit area. However, one significant problem of the three dimensional chip stack is the thermal density of the stack. For a four layer 3 dimensional chip stack, the surface area presented to the heat sink by the chip stack has only ¼ of the surface area presented by the two-dimensional approach. For a 4-layer chip stack, there are three layer-layer thermal interfaces in addition to the final layer to grease/heat sink interface. The heat from the bottom layers must be conducted up thru the higher layers to get to the grease/heat sink interface.

On the chip side (i.e. the heat source), there usually exists hotspots, areas of higher power density, where most of the processing takes place, which results in a temperature gradient across the chip. These areas of higher heat and power density need to be kept within a set temperature range in order for the chip to perform properly and to pass quality and specification tests at the end of manufacturing.

Accordingly, it would be desirable to provide for reduced thermal resistance between heat sources and a cooling device that is both efficacious and yet not require changes to the microprocessor fabrication process.

BRIEF SUMMARY

The exemplary embodiments of the present invention provide a method and system for aligning graphite nanofibers in a thermal interface material used in three-dimensional chip stacks. In particular, to a method and system for horizontally aligning graphite nanofibers in etched silicon wafer troughs for enhanced thermal performance.

An exemplary embodiment includes a method for enhancing the cooling of a chip stack of semiconductor chips. The method includes creating a first chip with circuitry on a first side, and creating a second chip electrically and mechanically coupled to the first chip by a grid of connectors. The method further includes placing a thermal interface material pad between the first chip and the second chip, wherein the thermal interface material pad includes nanofibers aligned parallel to mating surfaces of the first chip and the second chip, and creating a heat removal device thermally connected to the thermal interface material pad.

Another exemplary embodiment includes a method for creating an enhanced thermal interface material pad for cooling of a chip stack of semiconductor chips. The method includes creating a first chip with circuitry on a first side, etching gaps into the first chip on a second side, and creating the enhanced thermal interface material pad, wherein the enhanced thermal interface material pad includes nanofibers aligned parallel with each other and to mating surfaces of the first chip and enhanced thermal interface material pad. The method further includes etching channels into the enhanced thermal interface material pad mating to the gaps etched on the first chip, wherein the nanofibers are aligned parallel with gaps etched on the first chip, and creating a heat removal device thermally connected to the enhanced thermal interface material pad.

Another exemplary embodiment includes a chip stack of semiconductor chips with enhanced cooling apparatus. Briefly described in terms of architecture, one embodiment of the apparatus, among others, is implemented as follows. The chip stack of semiconductor chips with enhanced cooling apparatus includes a first chip with circuitry on a first side and a second chip electrically and mechanically coupled to the first chip by a grid of connectors. The apparatus further includes a thermal interface material pad between the first chip and the second chip, wherein the thermal interface material pad includes nanofibers aligned parallel to mating surfaces of the first chip and the second chip, and a heat removal device thermally connected to the thermal interface material pad.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawings and detailed description of the invention are exemplary and explanatory of preferred embodiments of the invention, and are not restrictive of the invention, as claimed.

BRIEF DESCRIPTION OF THE SEVERAL VIEWS OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 2C is a block diagram illustrating an example of the slicing of the thermal interface material into the desired footprint.

FIGS. 3A and 3B are block diagrams illustrating an example of the thermal interface material with graphite nanofibers aligned by a magnetic field and heat to orient the conductive axis in perpendicular directions to the thermal interface material, and having a plurality of punch holes formed at various locations thereon.

FIG. 3C is a block diagram illustrating an example of a top view of the thermal interface material with graphite nanofibers aligned by a magnetic field to orient the conductive axis in perpendicular directions to the thermal interface material, and having a plurality of punch holes formed at various locations thereon.

FIG. 3D is a block diagram illustrating an example of a side view of the thermal interface material with graphite nanofibers aligned by a magnetic field to orient the conductive axis in perpendicular directions to the thermal interface material having the etched channels in the silicon between bump attachments to enhance horizontal heat flow.

FIG. 3E is a block diagram illustrating an example of the vectors in which the graphite nanofibers are aligned.

FIG. 4 is a block diagram illustrating an example of the thermal interface material with graphite nanofibers horizontally/vertically aligned such that two opposite sides of the thermal interface material with graphite nanofibers conduct heat in the east/west direction and another two opposite sides conduct heat in the north/south direction.

FIG. 5 is a block diagram illustrating another example of the thermal interface material with graphite nanofibers horizontally/vertically aligned such that two opposite sides of the thermal interface material with graphite nanofibers conduct heat in the east/west direction and another two opposite sides conduct heat in the north/south direction.

Figure 1A:
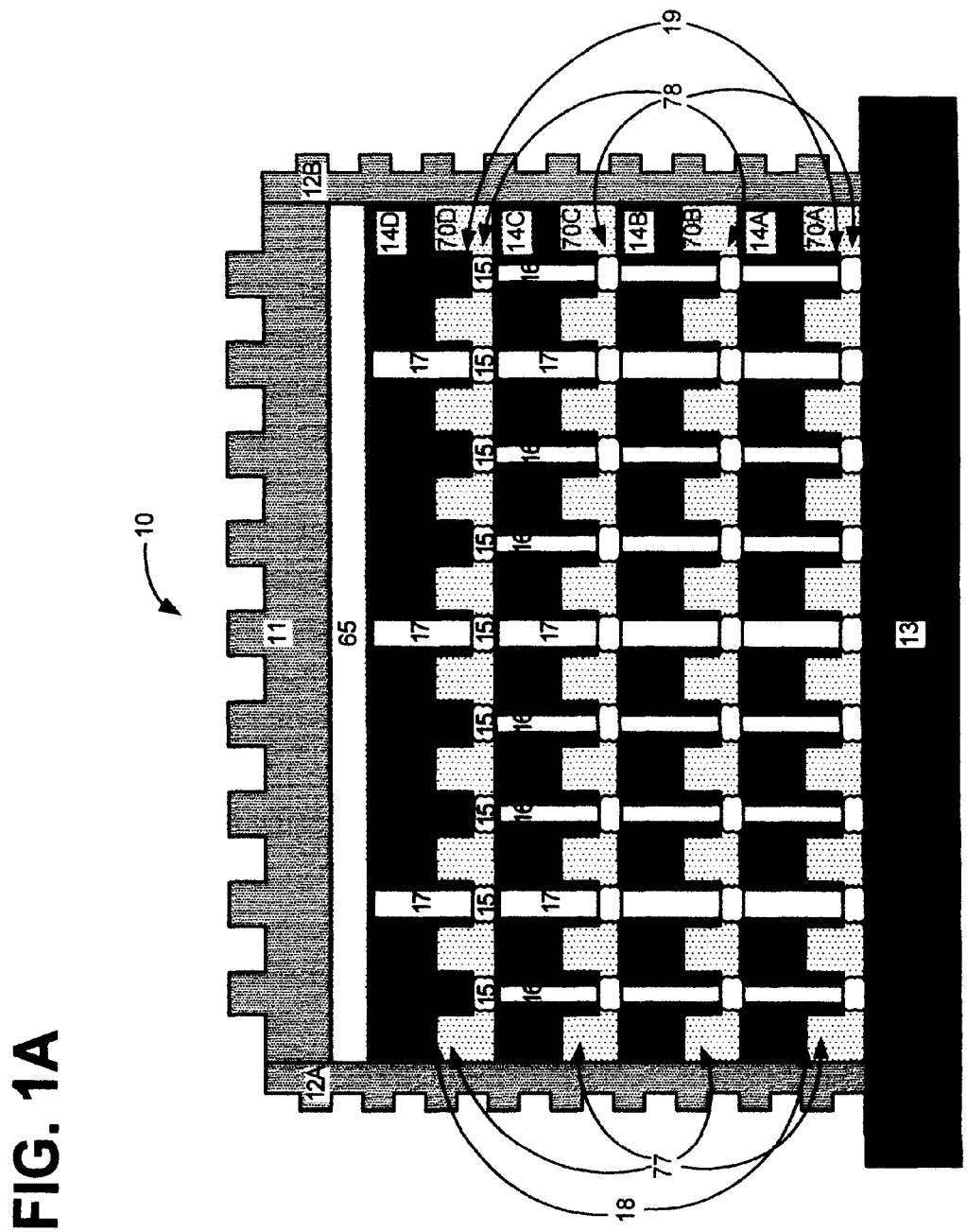
FIG. 1A is a cross section block diagram illustrating an example of a silicon device stack with the C4 or flip chip connection channels utilizing a thermal interface material with horizontally aligned carbon nanotubes/nanofibers arranged between all chips to conduct heat to a heat sink on the side of the stack, and a thermal interface material with vertically aligned carbon nanotubes/nanofibers to conduct heat from the top chip to a heat sink on top of the stack, of the present invention.

The detailed description explains the preferred embodiments of the invention, together with advantages and features, by way of example with reference to the drawings.

DETAILED DESCRIPTION OF EXAMPLE EMBODIMENTS

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention.

One or more exemplary embodiments of the invention are described below in detail. The disclosed embodiments are intended to be illustrative only since numerous modifications and variations therein will be apparent to those of ordinary skill in the art.

One or more exemplary embodiments of the invention are directed to providing a material that is placed between chips in a chip stack. The materials having carbon nanofibers/nanotubes aligned to efficiently transfer heat to at least two sides (e.g., east and west, or north and south) of a chip stack. The materials having carbon nanofibers/nanotubes aligned transfers heat more efficiently along the axis of the carbon nanofibers/nanotubes. The carbon nanofibers are formed around magnetic "seeds". The material is heated and the carbon nanofibers/nanotubes are mixed into a liquified material. A magnetic field is applied in a direction parallel to sides of a pad that would be in contact with semiconductor chips or other like electronic devices. The field is strong enough to align the carbon nanofibers/nanotubes. The material is then cooled, sliced into pads and placed between layers of chips in the chip stack. In one embodiment, all carbon nanofibers/nanotubes are aligned "east/west" and draw the heat to heat sinks on the east and west sides of the chip stack. In another embodiment, a plurality of chips are stacked and interconnected with bumps. The TIM (thermal interface material) having horizontally aligned carbon nanotubes/nanofibers are arranged between all chips but the top chip, which has a vertically aligned carbon nanotubes to conduct heat from the top chip to a heat sink. The horizontally aligned carbon nanotubes between the lower chips conduct heat to the sides, where a heat pipe draws heat from the sides. Once the heat is brought to the edges of the stack by utilizing chip trenches with aligned CNT or GNF, one must efficiently couple it to the external heat sink. In this solution the horizontally aligned GNFs in the TIM is wrapped up to the heatsink. This creates a single contiguous thermal path from the inner chip to the heatsink. It is relevant to note that the vertical distances in the diagrams are roughly two orders of magnitude shorter than the horizontal distances.

In still another embodiment, the pads are alternated among chips so that alternating layers draw heat to heat sinks on the east/west sides of the chip stack and to the north/south side of the chip stack. In still another embodiment, pieces of the pads are arranged such that two opposite sides of the arrangement conduct heat east/west and another two opposite sides conduct heat north/south. In this embodiment, the carbon nanofibers/nanotubes are arranged so that both ends are perpendicular to the closest edge of the pad.

It is well established that the incorporation of certain types of materials with sufficient flow characteristics to "flow" and "fill" those gaps are not very thermally conductive. Materials with low-viscosity/high surface tension are required to fill the space between the layers of chips in a chip stack. Thermal properties of underfills and other adhesives are improved by mixing (or "filling") ceramic, metal, and/or other particulate or strands into the primary polymer, epoxy, or matrix.

A thermal interface material is used to fill the gaps between thermal transfer surfaces, such as between microprocessors and heatsinks, in order to increase thermal transfer efficiency. These gaps are normally filled with air which is a very poor conductor. A thermal interface material may take on many forms. The most common is the white-colored paste or thermal grease, typically silicone oil filled with aluminum oxide, zinc oxide, or boron nitride. Some brands of thermal interface materials use micronized or pulverized silver. Another type of thermal interface materials are the phase-change materials. The phase change materials are solid at room temperature, but liquefy and behave like grease at operating temperatures.

A phase change material is a substance with a high heat of fusion which, melting and solidifying at a certain temperature, is capable of storing and releasing large amounts of energy. Heat is absorbed or released when the material changes from solid to liquid and vice versa; thus, phase change materials are classified as latent heat storage units.

Phase change materials' latent heat storage can be achieved through solid-solid, solid-liquid, solid-gas and liquid-gas phase changes. However, the only phase change used for thermal interface phase change materials is the solid-liquid change. Liquid-gas phase changes are not practical for use as thermal storage due to the large volumes or high pressures required to store the materials when in their gas phase. Liquid-gas transitions do have a higher heat of transformation than solid-liquid transitions. Solid-solid phase changes are typically very slow and have a rather low heat of transformation.

Initially, the solid-liquid phase change materials behave like sensible heat storage materials; their temperature rises as they absorb heat. Unlike conventional sensible heat storage, however, when phase change materials reach the temperature at which they change phase (i.e. melting temperature) they absorb large amounts of heat at an almost constant temperature. The phase change material continues to absorb heat without a significant rise in temperature until all the material is transformed to the liquid phase. When the ambient temperature around a liquid material falls, the phase change material solidifies, releasing its stored latent heat. A large number of phase change materials are available in any required temperature range from −5° C. up to 190° C. Within the human comfort range of 20° to 30° C., some phase change materials are very effective. They can store 5 to 14 times more heat per unit volume than conventional storage materials such as water, masonry, or rock.

It is well known that the incorporation of certain types of carbon nanofibers into thermal interface material can impart thermal conductivity to such materials. Carbon nanofibers or carbon nanotubes can be dispersed in thermal interface material by various well-known techniques. These techniques include, but are not limited to, melting, kneading and dispersive mixers to form an admixture that can be subsequently shaped to form a thermally conductive article.

Nanofibers are defined as fibers with diameters on the order of 100 nanometers. They can be produced by interfacial polymerization and electrospinning. Carbon nanofibers are graphitized fibers produced by catalytic synthesis around a catalytic core. The catalytic core around which graphite platelets are formed is, for exemplary purposes, called a metal seed or a catalytic metal seed, wherein the catalytic metal seed is a material having magnetic properties such as iron, cobalt, or nickel. Other non-metal materials suitable for forming magnetically alignable graphite nanofibers are within the scope of the invention.

Graphite nanofibers can be grown in numerous shapes around a catalytic metal seed. From the physical point of view, graphite nanofibers vary from 5 to 100 microns in length and are between 5 to 100 nm in diameter. The graphite nanofibers comprised of graphite platelets are arranged in various orientations with respect to the long axis of the fiber, giving rise to assorted conformations. In one embodiment, a magnetic field is applied to the metal catalyst prior to deposition of the graphite nanofibers on the metal-core. With the application of a magnetic field, the magnetic poles of the seed are aligned with the magnetic field and will subsequently carry the attached graphite nanofibers along with them as they rotate in the applied field following deposition.

With a diamond shaped catalytic metal seed, the majority of the graphite platelets will align along the fiber axis as dictated by an external magnetic field, so that the catalytic metal seed may have its poles aligned perpendicular to or parallel to the external magnetic field. The seed particles are not limited to elongated diamonds, so that the deposited metal-core graphite nanofiber form chevrons. The graphite platelets can assume any of a myriad of shapes. If the catalytic metal seeds are rectangular plates, then the graphite platelets are deposited as plates. If the catalytic metal seeds are cylindrical, then the graphite platelets are deposited as cylindrical plates. If the catalytic metal seeds are little bars, then the graphite platelets are deposited as rectangular solids along the long axis of the rectangular bar. The graphite platelets assume the geometry of the catalytic metal seed surface.

Carbon nanotubes (CNTs) are allotropes of carbon with a cylindrical nanostructure. Nanotubes have been constructed with a length-to-diameter ratio of up to 132,000,000:1, significantly larger than any other material. They exhibit extraordinary strength and unique electrical properties, and are efficient thermal conductors.

Nanotubes are members of the fullerene structural family, which also includes the spherical buckyballs. The ends of a nanotube may be capped with a hemisphere of the buckyball structure. Their name is derived from their size, since the diameter of a nanotube is on the order of a few nanometers (approximately 1/50,000th of the width of a human hair), while they can be up to 18 centimeters in length.

Graphite nanofibers and nanotubes have received considerable attention in the electronics field due to their remarkable thermal conductivity. Moreover, the thermal conductivity of graphite nanofibers and nanotubes are anisotropic. Anisotropy is the property of being directionally dependent, as opposed to isotropy, which implies homogeneity in all directions. Therefore, the present invention takes advantage of the anisotropic nature of the graphite nanofibers and nanotubes by effectively aligning them along the conductive axis, thereby generating a thermal interface material with exceptional thermal conductivity at comparatively low loading levels. Diamond, graphite, and graphite fibers have been known as excellent heat conductors with a high thermal conductivity up to 3000 W/m-K.

All nanotubes are expected to be very good thermal conductors along the tube, exhibiting a property known as "ballistic conduction", but good insulators laterally to the tube axis. Measurements show that a single wall nanotube has a room-temperature thermal conductivity along its axis of about 3500 W/m·K compared to copper, a metal well-known for its good thermal conductivity, which transmits 385 W/m·K. A single wall nanotube has a room-temperature thermal conductivity across its axis (in the radial direction) of about 1.52 W/m·K, which is about as thermally conductive as soil. Diamond, graphite, and graphite fibers have been known as excellent heat conductors with a high thermal conductivity up to 3000 W/m-K. Table 1 lists the maximum power per chip which can be cooled effectively, assuming 100% coverage, with the incorporation of certain types of materials into thermal interface materials and the thermal conductivity of such materials.

TABLE 1

| TIM Materials | Conductivity (W/mK) | Power (W) per chip |
|---|---|---|
| Grease | 2.8 | 35 |
| Gel | 5.7 | 80 |
| CNF | 6000 | >300 |
| CNT | 3500 | ~150 |

Referring now to the drawings, in which like numerals illustrate like elements throughout the several views.

FIG. 1A is a cross section block diagram illustrating an example of a silicon device stack 10 (i.e. chip stack) with the controlled collapse chip connection (i.e. C4) or flip chip electrically conductive channels 16 and/or thermal conductive channels 17 utilizing a thermal interface material pad 70 with horizontally aligned carbon nanotubes/nanofibers arranged between all chips 14 to conduct heat to heat sinks 12 on the side of the chip stack 10, and a thermal interface material block 65 with vertically aligned carbon nanotubes/nanofibers to conduct heat from the top chip 14D to a heat sink 11 on top of the chip stack 10, of the present invention.

The chip stack 10 comprises a multitude of chips 14(A-D) that further include one or more electrically conductive channels 16 and/or thermal conductive channels 17, which extend through a chip 14 from the top surface to the bottom surface. In one embodiment, the "conductive channel" is really a combination of two or more thru-silicon-vias (TSVs) connected sequentially by one or more controlled collapse chip connection 16 and 17 (C4s).

Preferably, the electrically conductive channels 16 are formed of tungsten or copper; however, other conductive materials may be used and are contemplated. The electrically conductive channels 16 selectively conduct electrical signals to and from portions of the circuitry on chips 14(A-D) thereon or simply couple to solder bumps 15 to interconnect differing chips 14 in the chip stack 10 (e.g., chips 14A and 14B), or both. The solder bumps 15 are located within an area 71 (FIG. 3(A-C)) of a thermal interface material (TIM) pad 70. In one embodiment, the area 71 is punched out of the TIM pad 70. In another embodiment, the area 71 is formed during the creation of the TIM pad 70.

The TIM pad 70 comprises carbon nanotubes (CNTs) or graphite nanofibers (GNFs) that are dispersed in a phase change material (PCM) or a silicone grease. The CNTs or GNFs are then aligned in the xy plane (i.e. positioned parallel to the surface of the chip 14). This is so that heat may be brought to the multiple heat sinks 12(A-B) on the edges of the chip stack 10. Once the heat is brought to the edges of the chip stack 10, multiple heat sinks 12(A-B) or other type devices may be utilized to more efficiently dissipate the heat of the chip stack 10.

The CNTs or GNFs are aligned in the thermal interface material 50 in one direction by an applied magnetic field. By aligning the CNTs or GNFs along the conductive axis in the xy plane of the 3D chip stack 10 creates a TIM pad 70 with exceptional thermal conductivity at comparatively low loading levels. The system and method for aligning graphite nanofibers to enhance thermal interface material performance are described in commonly assigned and co-pending U.S. patent application entitled "A METHOD AND SYSTEM FOR ALIGNMENT OF GRAPHITE NANOFIBERS FOR ENHANCED THERMAL INTERFACE MATERIAL PERFORMANCE", Ser. No. 12/842,200 filed on, Jul. 23, 2010, herein incorporated by reference.

Preferably, the thermal conductive channels 17 are formed and filled with conductive materials, metal or alternatively are formed of thermal grease. The thermal grease is typically silicone oil filled with aluminum oxide, zinc oxide, or boron nitride; however, other conductive materials may be used and are contemplated. Some brands of TIMs used in the thermal conductive channels 17 use micronized or pulverized silver. Another type of TIM used in thermal conductive channels 17 are the phase-change materials. The phase change materials are solid at room temperature, but liquefy and behave like grease at operating temperatures. The thermal conductive channels 17 conduct heat to and from portions of the circuitry on chips 14(A-D) thereon. The thermal conductive channels 17 couple to solder bumps 15 to interconnect differing chips 14 in the chip stack 10 (e.g., chips 14A and 14B), couple to heat sink 11 through TIM block 65 of the present invention, that conducts the heat to the side of the chip stack 10.

The conductive channels 16 couple to solder bumps 15 on a bond pad (not shown) on the bottom surface of chip 14A-C. The solder bumps 15 are electrically isolated from the chip 14 and one another according to conventional practice. In addition, the conductive channels 16 are preferably electrically insulated from the chip 14 by insulating regions (not shown) which are disposed between the conductive channels 16 and the chip 14. The insulating regions preferably are silicon dioxide (SiO$_2$); however, other insulating materials may be employed and are contemplated as falling within the scope of the present invention. The insulating regions prevent the signals being transmitted in the electrically conductive channels 16 from disturbing the bias voltage of the chip 14 (which is typically either a ground potential or a Vdd). Of course, in some cases, one of the terminals of the circuitry on chips 14(A-D) on the top surface may be held at a substrate potential, in which case, the appropriate electrically conductive channel 16 may be non-insulated and thus be in electrical contact with the chip 14 being held at a similar potential, as may be desired.

As shown, each chip 14 uses conductive channels 16 in a controlled, collapse chip connection (C4) structure (also often called solder bump or flip-chip bonding). The chip stack 10 includes a circuit board or substrate 13 that is connected to a base chip 14A. Solder bumps 15 are then placed on a bond pad (not shown) for the electrically conductive channel 16 of a second (or top) chip 14A, which is oriented face-down (i.e., flip-chip), aligned and brought into contact with the conductive channels 16. Electrical interconnections between the electrically conductive channels 16 are formed by heating the solder bumps 15 to a reflow temperature, at which point the solder flows. After the solder flows, subsequent cooling results in a fixed, electrically conductive joint to be formed between the electrically conductive channels 16.

The base chip 14A on one side is attached to a circuit board or substrate 13 and TIM pad 70 between the circuit board or substrate 13 and the base chip 14A. In an alternative embodiment, a TIM block 65 incorporating vertically aligned carbon (graphite) nanofibers can be utilized in place of the TIM pad 70 as a very effective thermal interface material between a top of base chip 14A and the circuit board or substrate 13. Such an arrangement is disclosed in U.S. patent application (entitled "A METHOD AND SYSTEM FOR ALIGNMENT OF GRAPHITE NANOFIBERS FOR ENHANCED THERMAL INTERFACE MATERIAL PERFORMANCE", Ser. No. 12/842,200). Other chips 14B-13D can have C4 connection structures implemented on both the top surface and bottom surface thereof, as illustrated in FIG. 1A. In such instances, chips 14B-D may similarly be oriented facedown with respect to the base chip 14A and coupled thereto using solder bumps 15. The top chip 14D is preferably connected to TIM block 65 incorporating vertically aligned carbon (graphite) nanofibers can be utilized in place of the TIM pad 70 as a very effective thermal interface material between a top of base chip 14A and the heat sink 11.

The C4 structure of FIG. 1A overcomes one disadvantage of the connection methodologies. Initially, because the ball-bonding attachment technique is avoided, significantly less stress is placed on the solder bump 15 during connection, which allows circuitry on chips 14(A-D) to be formed under the solder bump 15. The circuitry on chips 14(A-D) is formed according to any one of many conventional semiconductor processing techniques. However, the C4 structure of FIG. 1A has one major disadvantage of not being able to dissipate the heat generated by circuitry on chips 14(A-D). The TIM pad 70 of the present invention, comprises carbon nanotubes (CNTs) or graphite nanofibers (GNFs) that are dispersed in a phase change material (PCM) or a silicone grease. The CNTs or GNFs are aligned in the position parallel to the surface of the chip 14. This is so that heat may be brought to the edges of the chip stack 10. Once the heat is brought to the edges of the chip stack 10, multiple heat sinks 12(A-B) or other type devices may be utilized to more efficiently dissipate that heat of the chip stack 10. In one embodiment, all carbon nanofibers/nanotubes are aligned "east/west" and draw the heat to heat sinks 12(A-B) on the east and west sides of the chip stack 10. In another embodiment, the direction of the graphite nanofibers 51 in TIM pads 70 are alternated among chips 14(A-D) so that alternating layers draw heat to heat sinks 12(A-B) on the east/west sides of the chip stack and to the north/south (not shown) side of the chip stack 10.

In still another embodiment, the direction of the graphite nanofibers 51 in TIM pads 70 are parallel to etched gaps 18 in the circuitry into the chips 14(A-D) between bump 15 attachments to enhance horizontal heat flow. In one embodiment, the etched gaps 18 are created using reactive-ion etching (i.e. RIE), wet etch processes, laser milling, as part of the wafer thinning process with grinding/partial sawing, and/or similar processes. The bond pads now rest on substrate ridges 19 due to the etching of gaps 18.

The ridges 77 are aligned between bump 15 attachments to enhance horizontal heat flow. The etched channels 78 are utilized when the chips 14(A-D) have gaps 18 (FIG. 1A) etched in the wafer of the chips 14(A-D). The etched channels 78 are aligned with bump 15 attachments.

Figure 1B:
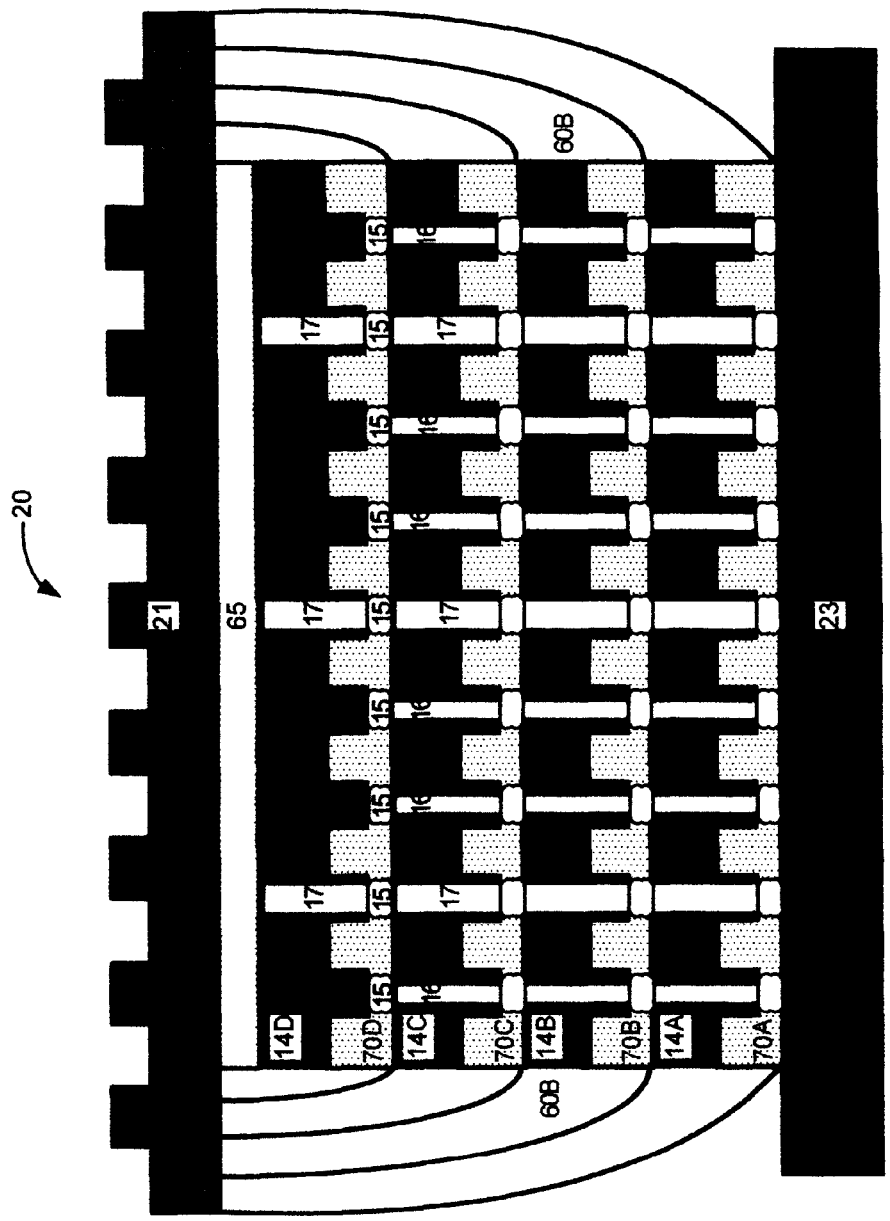
FIG. 1B is a cross section block diagram illustrating an example of a silicon device stack with the C4 or flip chip connection channels utilizing a thermal interface material with horizontally aligned carbon nanotubes/nanofibers arranged between all chips to conduct heat to wraps of TIM sheets that conducts heat to a heat sink at the top of the stack, and a thermal interface material with vertically aligned carbon nanotubes/nanofibers to conduct heat from the top chip to a heat sink on top of the chip stack, of the present invention.

FIG. 1B is a cross section block diagram illustrating an example of a chip stack 20 with the C4 or flip chip connection channels 16 and 17, utilizing TIM pads 70 with horizontally aligned carbon nanotubes/nanofibers arranged between all chips 14(A-D) to conduct heat to wraps of TIM sheets 60B that conducts heat to a heat sink 21 at the top of the chip stack 20. A TIM block 65 with vertically aligned carbon nanotubes/nanofibers is used to conduct heat from the top chip 14D to a heat sink 21 on top of the chip stack 10. In another alternative embodiment, the additional TIM blocks 65 are in thermal contact with edges of TIM sheets 60B hanging out between chips 14(A-D) to effectively draw heat to a heat sink 21 from the sides of the chip stack 10. The rest of the structure of chip stack 20 is similar to the description of chip stack 10 described above.

Figure 1C:
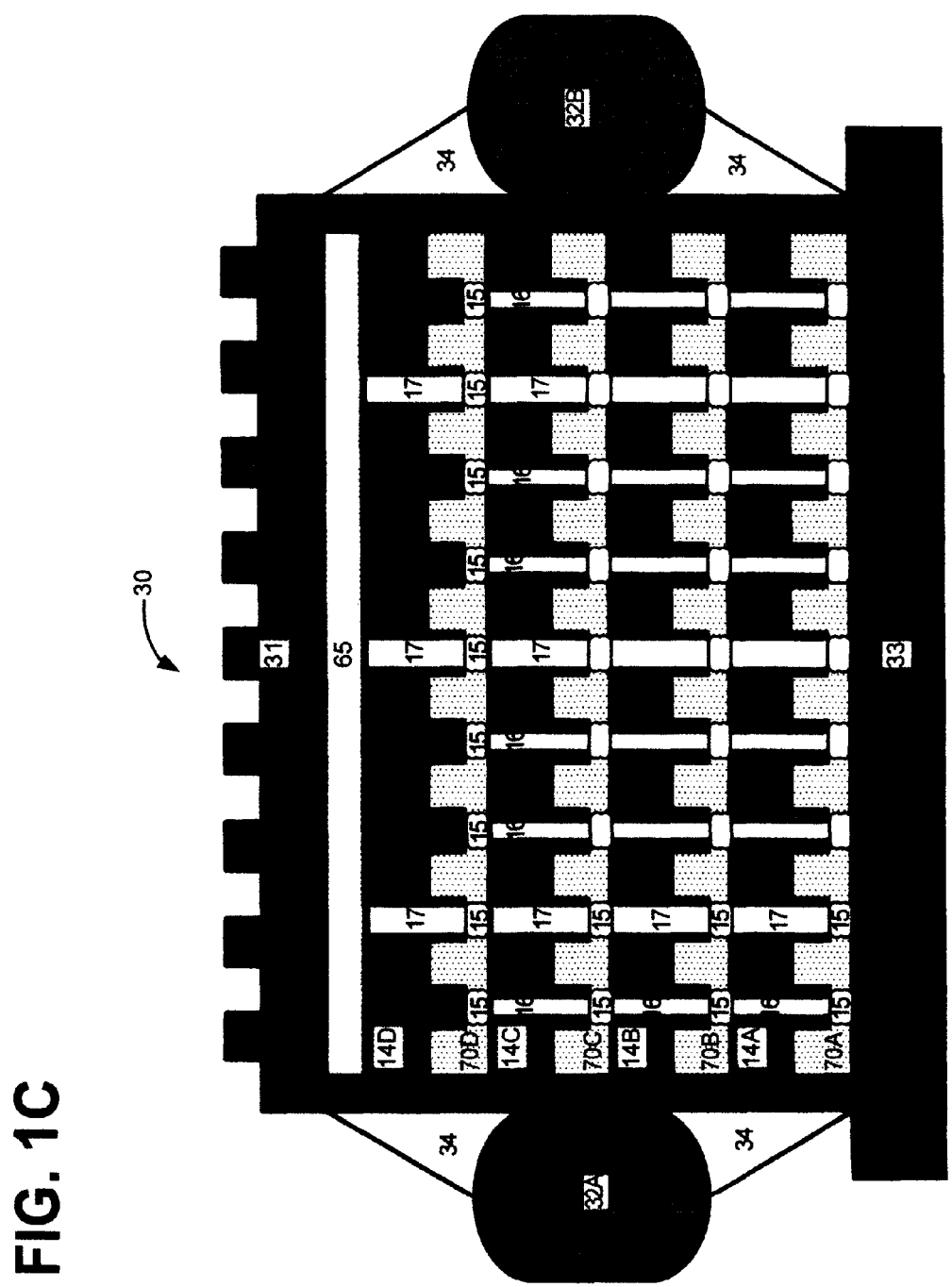
FIG. 1C is a cross section block diagram illustrating an example of a silicon device stack with the C4 or flip chip connection channels utilizing a thermal interface material with horizontally aligned carbon nanotubes/nanofibers arranged between all chips to conduct heat to heat pipes on the side of the stack, and a thermal interface material with vertically aligned carbon nanotubes/nanofibers to conduct heat from the top chip to a heat sink on top of the chip stack, of the present invention.

FIG. 1C is a cross section block diagram illustrating an example of chip stack 30 with the C4 or flip chip connection channels 16 and 17, utilizing TIM pads 70 with horizontally aligned carbon nanotubes/nanofibers arranged between all chips 14(A-D) to conduct heat to heat pipes 32(A-B) on the side of the chip stack 30. The TIM block 65 with vertically aligned carbon nanotubes/nanofibers will conduct heat from the top chip 14D to a heat sink 31 on top of the chip stack 30. The thermal filler 34 helps to conduct heat from the side of chip stack 30 to the heat pipe 32(A-B).

The rest of the structure of chip stack 30 is similar to the description of chip stack 10 described above. Since the structures of chip stacks 20 and 30 are similar to that of chip stack 10 except for the placement of the heat sinks or heat pipes, hereinafter, the chip stacks 10, 20 and 30, will be referred to as chip stack 10 for the sake of brevity.

Figure 2A:
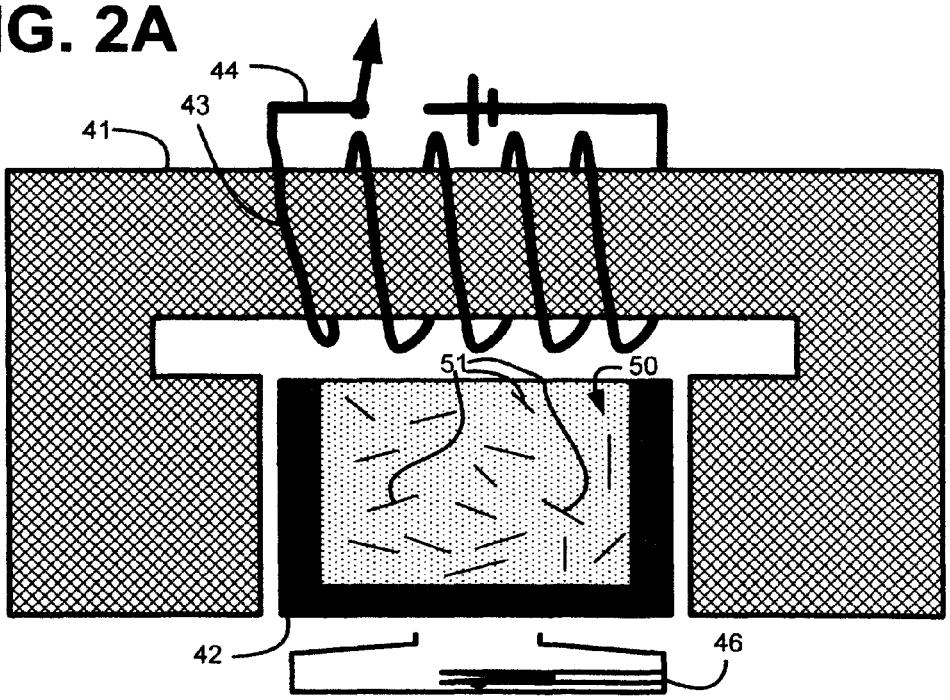
FIG. 2A is a block diagram illustrating an example of the graphite nanofibers randomly dispersed in the thermal interface material.

FIG. 2A is a block diagram illustrating an example of the graphite nanofibers 51 randomly dispersed in the thermal interface material 50. As shown, there is thermal interface material 50 in a crucible 42. The crucible 42 is heated to a temperature by heater 46 so that the thermal interface material 50 melts. In one embodiment, the thermal interface material 50 is melted at a temperature 10° C.-20° C. above the thermal interface material 50 melting temperature. In one embodiment, the thermal interface material 50 is a paraffin-based material and is surrounded on two sides by electromagnet 41. The magnetic fields are generated in the electromagnet 41 by coils 43 around the electromagnet 41. The coils 43 are connected to switch 44, which allows power to be applied.

Figure 2B:
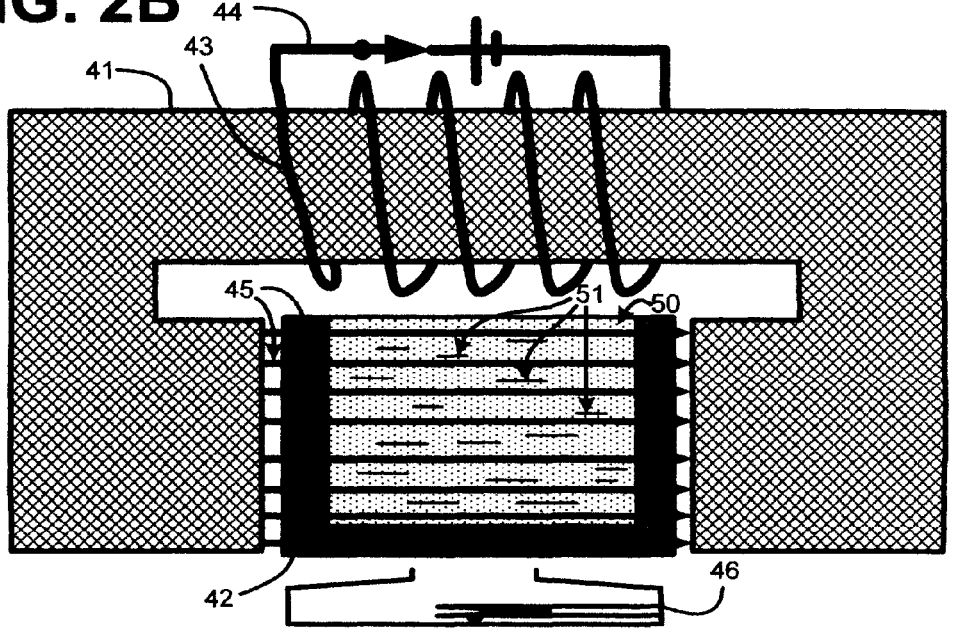
FIG. 2B is a block diagram illustrating an example of the heated thermal interface material with graphite nanofibers aligned by a magnetic field and heat to orient the conductive axis in the desired direction in the thermal interface material.

FIG. 2B is a block diagram illustrating an example of the thermal interface material 50 with graphite nanofibers 51 aligned by a magnetic field 45 to orient the conductive axis in the desired direction in the thermal interface material 50. A magnetic field 45 of sufficient intensity is applied to the thermal interface material 50 containing the graphite nanofibers 51, in order to align the graphite nanofibers 51. In one embodiment, the long axis of the graphite nanofibers 51 is aligned in an orientation parallel to the mating surfaces. In another embodiment, the graphite nanofibers 51 are aligned along the conductive axis of the graphite fibers. The crucible 42 is cooled to approximately room temperature. Once the crucible 42 with the aligned graphite nanofibers 51 in the phase change material has cooled to approximately room temperature, the thermal interface material 50 is removed from the crucible 42. In one embodiment, room temperature is normally within the range of 60 to 80° F. The thermal interface material 50 can be, but is not limited to, paraffins $(C_nH_{2n+2})$; fatty acids $(CH_3(CH_2)_nCOOH)$; metal salt hydrates $(M_nH_2O)$; and eutectics (which tend to be solutions of salts in water). In still another embodiment, the thermal interface material 50 can be silicone-based gels or pastes that are eventually cured into pads.

The graphite nanofibers 51 are dispersed into the melted thermal interface material 50 using well-established methods. In one embodiment, a high-speed dispersive mixer can be utilized. The amount of graphite nanofibers 51 in the thermal interface material 50 of the present invention will typically be in the range of 4 to 10 weight percent based on the amount of base phase change material, preferably ~5 weight percent. The graphite nanofibers 51 typically are dispersed essentially homogeneously throughout the bulk of the thermal interface material 50. The crucible 42 is cooled to approximately room temperature. The TIM pads 60 and block 65 are then cut to the desired footprint from the thermal interface material 50. Pads of appropriately sized geometry (length X and width Y) are cut from the slab of thermal interface material 50 using conventional techniques known to those skilled in the art. The footprint of the integrated circuit to which the TIM pads 60 and block 65 will be mated, dictates the geometry. In one embodiment, a TIM pad 60 is etched with channels 78 so that the direction of the graphite nanofibers 51 are parallel to etched channels 78. In this embodiment, the circuitry on chips 14(A-D) bump 15 attachments are on ridges 77 to enhance horizontal heat flow to create TIM pad 70.

According to the present disclosure, the thermal conductivity at desired locations is increased by TIM pads 70 and block 65 with aligned graphite nanofibers 51 between the multiple chips 14A-D. By utilizing the TIM pad 70 with aligned graphite nanofibers 51 between multiple chips 14A-D, more heat transfer to the edge of the chip stack 10 can be achieved. The advantage of this solution is that it further reduces chip temperatures through no modification to the chip surface and does not require changes to the manufacturing line or the addition of more components to the system such as liquid coolants and microchannel heat exchangers.

FIG. 2C is a block diagram illustrating an example of the slicing of the thermal interface material 50 into the desired footprint or TIM pad 70 and block 65. TIM pads 60 of appropriately sized geometry (length X and width Y) are cut from the slab of thermal interface material 50 using conventional techniques of dicing apparatus 58 known to those skilled in the art. The geometry of TIM pads 60, 65 and 70, are dictated by the footprint of the integrated circuitry on chips 14(A-D) to which the TIM pads 60, 65 and 70, will be mated. Blocks 65 of appropriately sized geometry (length X and width Y) are cut from the slab of thermal interface material 50 using conventional techniques of dicing apparatus 58 known to those skilled in the art. The block 65 is rotated so that the graphite nanofibers 51 are vertically aligned. In one embodiment, the footprint of the vertical shaft to which the TIM pads 60 or 70, is constructed around the geometry of block 65.

FIGS. 3A and 3B are block diagrams illustrating an example of a top view of the TIM pad 70 with graphite nanofibers 51 aligned by a magnetic field 45 to orient the conductive axis in perpendicular directions to the TIM pad 70, and having a plurality of areas 71 formed at various locations thereon. Areas 71 provide space for the solder bumps 15 that are formed on conductive channels 16, on the chip 14. The solder bumps 15 rest on conductive channels 16 to connect one chip to another chip through TIM pad 70 to electrically conductive signals from, for example, chip 14A to another chip 14B. In another embodiment, the solder bumps 15 can conduct heat from, for example, chip 14A to another chip 14B and eventually to heat sink 11. In another embodiment, the solder bumps 15 can conduct heat laterally from the solder bumps 15 through TIM pad 70(A-D) and between two chips 14(A-D) to the edges of the chip stack 10. In still another embodiment, the direction of the graphite nanofibers 51 in TIM pads 60 are alternated among chips so that alternating layers draw heat to heat sinks on the east/west sides of the chip stack and to the north/south side of the chip stack.

As shown, the plurality of solder bumps 15 and areas 71 are circular, however, this is for illustration only and the solder bumps 15 and areas 71 may be of any shape including, but not limited to, triangular, rectangular, square, circular, elliptical, irregular or any four or more sided shape. The size and shape of areas 71 are generally determined by the size and shape of solder bump 15. This is in order to provide a space in the TIM pad 70 for the solder bumps 15.

Also as shown, the solder bumps 15 and areas 71 in one embodiment are laid out in regular patterns, however, this is for illustration only and the solder bumps 15 and areas 71 have the flexibility to be laid out in any desired pattern. This additional level of flexibility allows the circuitry on chips 14(A-D) to be laid out without regard to the solder bumps 15 and areas 71 locations. This further allows the solder bump 15 locations above the circuitry on chips 14(A-D) to be located in an optimized fashion, to directly couple with circuitry on another chip 14. In another embodiment, the solder bumps 15 and areas 71 may be formed in a pattern where the conductive channels 16 provide power at the periphery of the chip 14 to aid in cooling the chip 14. Therefore, the solder bumps 15 and areas 71 may be located anywhere on the chip 14A-D as illustrated in FIG. 1, without the need to form such interconnections on peripheral edges of the die. The solder bumps 15 are located within an area 71 (FIG. 3(A-C)) of a thermal interface material (TIM) pad 70. In one embodiment, the area 71 is punched out of the TIM pad 70. In another embodiment, the area 71 is formed during the creation of the TIM pad 70. In one embodiment, a TIM pad 60 is etched with channels 78 so that the direction of the graphite nanofibers 51 are parallel to etched channels 78. In this embodiment, the circuitry on chips 14(A-D) bump 15 attachments are on ridges to enhance horizontal heat flow to create TIM pad 70. A TIM pad 70 is used to remove any gaps between thermal transfer surfaces, such as between chips 14(A-D), microprocessors and heat sinks, in order to increase thermal transfer efficiency. Any gaps are normally filled with air, which is a very poor conductor.

FIG. 3C is a block diagram illustrating a top view example of the TIM block 65 with graphite nanofibers 51 oriented with the conductive axis in parallel with the solder bumps 15 and areas 71 on the TIM block 65. There are a plurality of areas 71 formed at various locations thereon. These areas 71 are for the solder bumps 15 to connect chips 14(A-D) together. In an alternative embodiment, a second TIM block 65 is in thermal contact with the center of TIM blocks 65 between chips 14(A-D) to effectively draw heat to a chip above and below to ultimately connect to heat sink 11 on a top of the chip stack 10. In another alternative embodiment, the additional TIM blocks 65 are in thermal contact with edges of TIM pads 60 hanging out between chips 14(A-D) to effectively draw heat to a heat sink 11 on the sides of the chip stack 10.

FIG. 3D is a block diagram illustrating an example of a side view of the TIM pad 70 with graphite nanofibers 51 aligned by a magnetic field to orient the conductive axis so that the direction of the graphite nanofibers 51 are parallel to etched channels 78. The etched channels 78 are aligned with bump attachments 15 to enhance horizontal heat flow. The etched channels 78 are utilized when the chips 14(A-D) have gaps 18 etched in the wafer of the chips 14(A-D) (FIG. 1A). The etched gaps 18 in the chips 14(A-D) are between bump attachments 15.

FIG. 3E is a block diagram illustrating an example of the vectors in which the graphite nanofibers 51 are aligned. In this illustration, the nanofibers 51 are either horizontally (i.e. XWY plane) or vertically (i.e. XWZ plane) aligned through the chip stack using graphite nanofibers 51, as shown in FIGS. 3A-3C. The vertical nanofibers 51 (i.e XWZ plane) are in a plane perpendicular to the horizontal nanofibers 51 (i.e. XWY plane). In order to differentiate the nanofibers 51 oriented in the horizontal plane (i.e. XWY plane) from the nanofibers 51 oriented in the vertical plane (i.e. XWZ plane), from now on those fibers oriented in the vertical plane (i.e. XWZ plane) will be referred to as nanofibers 52. This means that the graphite nanofibers 51 are always aligned in the horizontal plane (i.e. XWY plane) perpendicular to the closest side edge (i.e. not top or bottom) of TIM pad 50. Whereas, nanofibers 52 on block 65 are aligned in the vertical plane (i.e. XWZ plane) and always perpendicular to all graphite nanofibers 51.

FIG. 4 is a block diagram illustrating a top down view example of the TIM pad 80 with graphite nanofibers 51 arranged such that two opposite sides of the TIM pad 80 with graphite nanofibers 51 conduct heat in one direction parallel with the sides of the TIM pad 80 in contact with chip 14 and another two on opposite sides conduct heat in a second direction perpendicular to the first direction and still parallel with the sides of the TIM pad 80 in contact with chip 14. The illustrated example also shows the TIM pad 80 with a vertical heat transmission block 85 (i.e. thermal channel) that includes nanofibers 52 that are perpendicular to all graphite nanofibers 51 in the TIM pad 80. In this embodiment, the bi-directional TIM pad 80 displayed in the top down view illustrated in FIGS. 3A and 3B can be easily sectioned and connected together to conduct heat to all four sides of the chip stack using graphite nanofibers 51, and vertically through the vertical heat transmission block 85 using nanofibers 52, as shown. The vertical heat transmission block 85 is formed (i.e. cut) from block 65 illustrated in FIG. 3C. This means that the graphite nanofibers 51 are always aligned in the horizontal plane (i.e. XWY and VZU plane) perpendicular to the closest edge of TIM pad 80. Whereas the nanofibers 52 on vertical heat transmission block 85 are aligned in the vertical plane (i.e. YWZ plane) and always perpendicular to all graphite nanofibers 51. In this embodiment, the pattern areas for the chip solder bumps 15 on TIM pad 80 are generally applied after assembling the TIM pad 80. This is to ensure that the area for the chip solder bumps 15 on chips 14(A-D) are properly aligned. The solder bumps 15 are located within an area 81 of a thermal interface material (TIM) pad 80. In one embodiment, the area 81 is punched out of the TIM pad 80. In another embodiment, the area 81 is formed during the creation of the TIM pad 80.

FIG. 5 is a block diagram illustrating another example of the TIM pad 90 with graphite nanofibers 51 arranged such that two opposite sides of the TIM pad 90 with graphite nanofibers 51 conduct heat in one direction parallel with the sides of the TIM pad 90 in contact with chip 14 and another two on opposite sides conduct heat in a second direction perpendicular to the first direction and still parallel with the sides of the TIM pad 90 in contact with chip 14. The illustrated example also shows the TIM pad 90 with a vertical heat transmission block 95 (i.e. channel) that includes nanofibers 52 that are perpendicular to all graphite nanofibers 51 in the TIM pad 90. In this embodiment, the bi-directional TIM pad 90 displayed in the top down view illustrated in FIGS. 3A and 3B can be easily sectioned and connected together to conduct heat to all four sides of the chip stack using graphite nanofibers 51 and vertically through the vertical heat transmission block 65 illustrated in FIG. 3C using nanofibers 52, as shown. This means that the graphite nanofibers 51 are always aligned in the XY plane perpendicular to the closest edge of TIM pad 60. Whereas the nanofibers 52 on block 95 are aligned in the ZWX or WZU plane and always perpendicular to all graphite nanofibers 51. In this alternative embodiment, the bi-directional TIM pad 60 displayed in a top down view illustrated in FIGS. 3A and 3B can be easily sectioned and connected together to conduct heat to all four sides of the chip stack as shown, so that the graphite nanofibers 51 conduct heat to the closest edge of the TIM pad 90. In this alternative embodiment, the TIM pad 90 is in a rectangular shape where the area of region A=B=C=D no matter what the W/L ratio of the rectangle. In this alternative embodiment, a chip stack 10 of memory chips is covered. The pattern areas for the chip solder bumps 15 on TIM pad 90 are generally applied after assembling the TIM pad 90. This is to ensure that the area for the chip solder bumps 15 on chips 14 are properly aligned.

Figure 6:
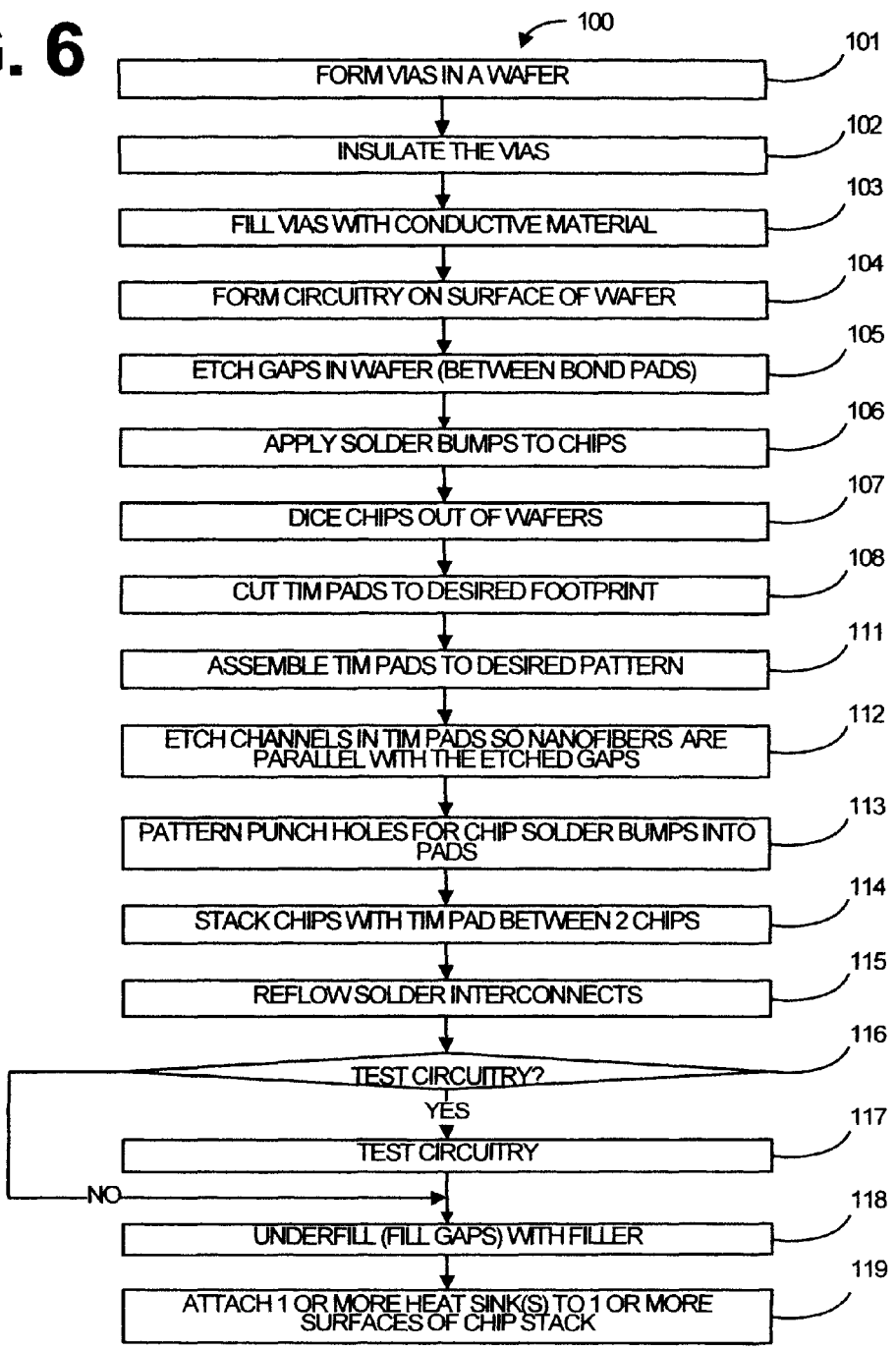
FIG. 6 is a flow chart illustrating an example of a method of forming a silicone device utilizing the thermal interface material with horizontally/vertically aligned carbon nanotubes/nanofibers that conducts heat to a heat sink/pipe, of the present invention.

FIG. 6 is a flow chart illustrating an example of a method of forming a chip stack 10 utilizing the TIM pad 70 with graphite nanofibers 51 horizontally/vertically aligned by a magnetic field 45 and heated to orient the conductive axis in the desired direction of the present invention. There are a couple approaches to forming the individual chips 14(A-D), and subsequent assembly, so the following is just one example of a method of constructing silicon devices in a multilayer chip stack 10 utilizing the thermal interface material pad 70 with aligned graphite nanofibers 51.

At step 101, conductive channels 16 and 17 (i.e. vias) are formed within a chip 14(A-D) on a wafer (not shown). At step 102, the electrically conductive channels 16 are insulated. In one embodiment, the insulating regions are silicon dioxide ($SiO_2$). However, other insulating materials may be used and are contemplated as falling within the scope of the invention. At step 103, the electrically conductive channels 16 are filled with a conductive material. In one embodiment, the conductive material may be comprised of either aluminum or copper. However, other conductive materials may be used and are contemplated as falling within the scope of the invention. In another embodiment, the thermal conductive channels 17 are filled with thermal grease that is typically silicone oil filled with a conductive particulate such as for example, but not limited to, aluminum oxide, zinc oxide, boron nitride, diamond, synthetic diamond, beryllium, and the like. However, other conductive materials may be used and are contemplated.

At step 104, the circuitry is formed on the surface of chip 14. The circuitry is formed thereon according to any one of many conventional semiconductor processing techniques. In one embodiment, the bond pads (not shown) are created when the circuitry is formed. At step 105, gaps 18 are etched into the chip 14 creating substrate ridges 19 with bond pads. In one embodiment, the etched gaps 18 are created using reactive-ion etching (i.e. RIE), wet etch processes, laser milling, as part of the wafer thinning process with grinding/partial sawing, and/or similar processes. The bond pads now rest on substrate ridges 19 due to the etching of gaps 18. In one embodiment, the size and shape of substrate ridges 19 are generally determined by the size and shape of solder bumps 15. This is to provide a minimum support for solder bumps 15. In another embodiment, the etching of the gaps 18 in the chip 14 may be performed prior to forming bond pads on the surface of the chip 14(A-D).

The solder bumps 15 are then formed on the bond pads that are on the bottom surface of the chip 14, at step 106. These solder bumps 15 are generally in alignment with the electrically conductive channels 16 in order to conduct electrical signals. In an alternative embodiment, thermal conductive channels 17 may conduct heat instead of electronic signals and use a solder bump 15 with thermal conductive ability. In one embodiment, a homogenous process is used to create solder bumps 15 for both electrically conductive channels 16 and any thermal conductive channels 17. In an alternative embodiment, the solder bumps 15 adhere to substantial portion of substrate ridges 19.

At step 107, the wafer (not shown) containing chips 14(A-D) is diced into individual chips. Chips of appropriately-sized geometry (length X and width Y thickness) are cut from the wafer using conventional techniques known to those skilled in the art. The geometry is dictated by the footprint of the circuitry on chip 14. Once the TIM 50 with the aligned graphite nanofibers 51 has cooled to approximately room temperature, the TIM 50 is cut to the desired footprint for TIM pads 60 and blocks 65. TIM pads 60 and blocks 65 of appropriately-sized geometry (length X, width Y and thickness Z) are cut from the slab of TIM 50 using conventional techniques known to those skilled in the art. The geometry of TIM pads 60 and blocks 65 are dictated by the footprint of the integrated circuit to which the TIM pads 60 and blocks 65 will be mated.

At step 111, the TIM pads 60 and TIM block 65 are assembled into the desired pattern. In one embodiment, the pattern is the approximately square TIM pad 80. In another embodiment, the pattern is a rectangular TIM pad 90. In still another embodiment, the pattern is any geometry configuration designed for chip stack 14(A-D).

At step 112, channels 78 are etched into the TIM pad 60 to create a TIM pad 80. Channels 78 are etched so that nanofibers 51 are parallel with the etched gaps 18 in chips 14(A-D). In addition, the etched gaps 18 allow for the etched channels 78 in the TIM pad 70 to enhance horizontal heat flow. The etched channels 78 are utilized when the chips 14(A-D) have gaps 18 etched in the wafer of the chips 14(A-D) (FIG. 1A). The etched gaps 18 in the chips 14(A-D) are between bump attachments 15.

At step 113, pattern punched holes for the chip solder bumps are placed (i.e. punched) within the TIM pads 80 and TIM block 85 corresponding with solder bumps 15 on chips 14(A-D). This will allow these solder bumps on chip 14(A-D) to extend through the TIM pads 80 and TIM block 85 in order to mechanically and electrically connect another chip 14(A-D).

At step 114, the chips 14(A-D) in the chip stack 10 are assembled. An example of this is to have the bottom surface of a first chip 14A coupled to a top surface of a second chip 14B. At step 115, the chip stack 10 is heated to a reflow temperature, at which point the solder in the solder bumps 15 flows. Subsequent cooling results in a fixed, electrically conductive joint to be formed between the electrically conductive channels 16, for example channels 16A and 16B.

At step 116, it is determined if the circuitry on chips 14(A-D) in chip stack 10 are to be tested. If it is determined in step 114 that testing the circuitry 14 in the chip stack 10 is not to be performed, then the gap etching method 100 skips this step 118. However, if it is determined at step 116 that the circuitry on chips 14(A-D) in chip stack 10 are to be tested, then the circuitry is tested for electrical performance, at step 117.

At step 118, any gaps between the chips 14(A-D) and the TIM pads 80 and TIM block 85 in chip stack 10 are filled with thermal filler. The thermal filler material is used to fill any space in the etched gaps 18 between thermal transfer surfaces, such as between chips 14(A-D), microprocessors and heat sinks (12, 21 or 32), in order to increase thermal transfer efficiency. A thermal filler material may take on many forms. In one embodiment, a white-colored paste or thermal grease, typically, silicone oil filled with aluminum oxide, zinc oxide, or boron nitride is used. In another embodiment, the thermal interface materials may use micronized or pulverized silver. In still another embodiment, the thermal interface materials may use phase-change materials. The phase change materials are solid at room temperature, but liquefy and behave like grease at operating temperatures. In one embodiment, the thermal filler is consistent throughout an etched gap 18. In an alternative embodiment, an etched gap 18 may comprise multiple materials. In the alternative embodiment, a first thermal filler material may be used to fill the lower portion of the etched gap 18, and a second thermal filler material to fill the upper portion of the etched gap 18. In this alternative embodiment, the first filler material may be electrically conductive because it is isolated from solder bumps 15 by the second filler material and substrate ridges 77. In this way, a first more highly thermal conductive material may be utilized even if it is electrically conductive due to its isolation from solder bumps 15.

At step 119, the gap etching method 100 attaches the heat sinks (12, 21 or 32) to one or more surfaces of one or more chips 14(A-D). In an alternative embodiment, after attaching TIM pads, 70, 80 and 90, to heat sink 21 (FIG. 1B), wraps of TIM sheets 50B are attached to the sides of the chip stack 10 in order to conduct heat to the heat sink 21 at the top of the stack. In still another alternative embodiment, after attaching TIM pads, 70, 80 and 90, to heat pipes 32 on the side of the chip stack 30 (FIG. 1C), a thermal filler material is applied in order to draw all heat from one entire side of chip stack 30 the heat pipes 32. In one embodiment, a white-colored paste or thermal grease, typically, silicone oil filled with aluminum oxide, zinc oxide, or boron nitride is used. In another embodiment, the thermal interface materials may use micronized or pulverized silver. In still another embodiment, the thermal interface materials may use phase-change materials. In one embodiment, a heat removal device is a heat sink, heat pipe ore the like.

The terminology used herein is for describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The flowchart and block diagrams in the Figures illustrate the functionality, and operation of possible implementations of systems and methods according to various embodiments of the present invention. In this regard, each block in the flowchart or block diagrams may represent a module, segment, or task to be performed, which comprises one or more executable steps for implementing the specified function(s). It should also be noted that, in some alternative implementations, the functions noted in the block may occur out of the order noted in the Figures. For example, two blocks shown in succession may in fact be performed substantially concurrently or the blocks may sometimes be executed in the reverse order, depending upon the functionality involved.

It should be emphasized that the above-described embodiments of the present invention, particularly any "preferred" embodiments, are merely possible examples of implementations set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

The invention claimed is:

1. A method for enhancing the cooling of a chip stack of semiconductor chips, comprising:
creating a first chip with circuitry on a first side;
creating a second chip with circuitry on a first side that is electrically and mechanically coupled to the first chip by a grid of connectors;
placing a thermal interface material pad between the first chip and the second chip, wherein the thermal interface material pad includes nanofibers aligned parallel to mating surfaces of the first chip and the second chip, wherein the first chip has etching gaps on a second side and the thermal interface material pad has etched channels and ridges that mate with the first chip, and wherein the nanofibers are aligned parallel to the etched gaps of the first chip; and creating a heat removal device thermally connected to the thermal interface material pad.

2. The method of claim 1, wherein the heat removal device comprises a heat sink.

3. The method of claim 2, wherein the heat sink is on one side of the chip stack.

4. The method of claim 3, wherein the heat sink is on top of the chip stack.

5. The method of claim 1, wherein the nanofibers aligned parallel to mating surfaces of the first chip and the second chip draw heat from the first chip and the second chip to the edges of the thermal interface material pad and to the heat removal device and nanofibers aligned perpendicular to mating surfaces of the first chip and the second chip creates a vertical heat transmission channel between the mating surfaces of the first chip and the second chip to the heat removal device.

6. The method of claim 5, wherein the vertical heat transmission block is created by cutting into pieces a thermal interface material with nanofibers aligned along the long axis of the thermal interface material, and assembling the pieces of the thermal interface material into the thermal interface material pad.

7. The method of claim 1, wherein the nanofibers are nanotubes.

8. A method for creating an enhanced thermal interface material pad for cooling of a semiconductor chip, comprising:

creating a first chip with circuitry on a first side;

etching gaps into the first chip on a second side;

creating the enhanced thermal interface material pad, wherein the enhanced thermal interface material pad includes nanofibers aligned parallel with each other and to mating surfaces of the first chip and enhanced thermal interface material pad;

etching channels into the enhanced thermal interface material pad mating to the gaps etched on the first chip, wherein the nanofibers are aligned parallel with gaps etched on the first chip; and creating a heat removal device thermally connected to the enhanced thermal interface material pad.

9. The method of claim 8, wherein the heat removal device comprises a heat sink.

10. The method of claim 9, wherein the heat sink is on one side of the chip stack.

11. The method of claim 10, wherein the heat sink is on top of the chip stack.

12. The method of claim 8, wherein the nanofibers draw heat from the first chip to the edges of the thermal interface material pad and to the heat HhFF removal device and nanofibers aligned perpendicular to mating surfaces of the first chip creates a vertical heat transmission channel between the mating surfaces of the first chip to the heat removal device.

13. The method of claim 12, wherein the vertical heat transmission block is created by cutting into pieces a thermal interface material with nanofibers aligned along the long axis of the thermal interface material, and assembling the pieces of the thermal interface material into the thermal interface material pad.

* * * * *